(12) United States Patent
Shimizume

(10) Patent No.: US 6,759,701 B2
(45) Date of Patent: Jul. 6, 2004

(54) TRANSISTOR CIRCUIT

(75) Inventor: Kazutoshi Shimizume, Kanagawa (JP)

(73) Assignee: Sony Corporation (JP)

( * ) Notice: Subject to any disclaimer, the term of this patent is extended or adjusted under 35 U.S.C. 154(b) by 28 days.

(21) Appl. No.: 09/953,907

(22) Filed: Sep. 18, 2001

(65) Prior Publication Data
US 2002/0047733 A1 Apr. 25, 2002

(30) Foreign Application Priority Data

Sep. 18, 2000 (JP) ..................................... P2000-281496
Nov. 10, 2000 (JP) ..................................... P2000-343330

(51) Int. Cl.$^7$ ..................... H01L 27/108; H01L 29/76; H01L 29/94; H01L 31/119; H03L 7/00
(52) U.S. Cl. ..................... 257/297; 257/349; 327/143; 327/65; 327/70; 327/198; 326/104
(58) Field of Search ..................... 327/143, 65, 70, 327/198; 326/104; 257/297, 349, 415, 417, 418, 419; 438/48, 50, 52

(56) References Cited

U.S. PATENT DOCUMENTS

| | | | | |
|---|---|---|---|---|
| 4,385,245 A | * | 5/1983 | Ulmer ........................ | 327/143 |
| 4,402,322 A | * | 9/1983 | Duggan ........................ | 607/9 |
| 4,731,553 A | * | 3/1988 | Van Lehn et al. ............. | 326/27 |
| 5,298,816 A | * | 3/1994 | Kaplinsky ................... | 327/427 |
| 5,565,799 A | * | 10/1996 | Houston ...................... | 327/52 |
| 5,751,651 A | * | 5/1998 | Ooishi ........................ | 365/226 |
| 5,926,428 A | * | 7/1999 | Rao ............................ | 365/207 |
| 5,929,662 A | * | 7/1999 | Alexander et al. ............ | 327/67 |
| 5,943,565 A | * | 8/1999 | Ju ............................... | 438/231 |
| 6,064,096 A | * | 5/2000 | Son ............................. | 257/368 |
| 6,104,221 A | * | 8/2000 | Hoon .......................... | 327/143 |
| 6,205,077 B1 | * | 3/2001 | Ferrant ..................... | 365/225.7 |
| 6,211,704 B1 | * | 4/2001 | Kong .......................... | 326/121 |
| 6,239,630 B1 | * | 5/2001 | Bowers et al. .............. | 327/143 |
| 6,288,586 B1 | * | 9/2001 | Ahn et al. ................... | 327/199 |
| 6,307,236 B1 | * | 10/2001 | Matsuzaki et al. .......... | 257/392 |
| 6,433,585 B1 | * | 8/2002 | Patel et al. .................. | 326/83 |
| 2001/0034093 A1 | * | 10/2001 | Matsuzaki et al. .......... | 438/199 |
| 2001/0040834 A1 | * | 11/2001 | Osishi ........................ | 365/226 |

FOREIGN PATENT DOCUMENTS

JP 362195922 A * 8/1987 .......... H03K/19/00

* cited by examiner

Primary Examiner—Amir Zarabian
Assistant Examiner—Ida M. Soward
(74) Attorney, Agent, or Firm—Rader, Fishman & Grauer PLLC; Ronald P. Kananen

(57) ABSTRACT

MOS transistors A and B form a transistor circuit (an inverter in this case). A MOS transistor D is one for interrupting leakage current that has a channel length longer than those of the MOS transistors A and B. Under the action of an enable terminal (Enable), the MOS transistor D conducts only while the circuit is operated, and does not conduct and thereby interrupts leakage current while the circuit is in a standby state. A MOS transistor C does not produce effect while the circuit is operated, and makes the potential of an output terminal (Output) a high potential or a low potential (not intermediate potential) only while the circuit is in the standby state. Therefore, the circuit controls unnecessary through-transistor current of a standby type circuit in a succeeding stage, which current is conventionally caused at an intermediate potential during standby.

11 Claims, 10 Drawing Sheets

C,D:MOS TRANSISTOR

C,D:MOS TRANSISTOR

O,P,Q,R:MOS TRANSISTOR

C', D': MOS TRANSISTOR

A,B,D:MOS TRANSISTOR

A,B,C,D : MOS TRANSISTOR

A,B,D': MOS TRANSISTOR

A,B,C',D': MOS TRANSISTOR

C, D, O, P, Q, R : MOS TRANSISTOR

C,D,H,I,J,K : MOS TRANSISTOR

A, B : MOS TRANSISTOR

TRANSISTOR CIRCUIT

BACKGROUND OF THE INVENTION

The present invention relates to a transistor circuit using a MOS transistor, and particularly to a transistor circuit that can reduce leakage current and the like of the circuit in a standby state and thereby reduce power consumption.

Conventionally, LSI (integrated circuit) has a state in which only signal processing operation of the LSI is stopped while power is applied to the LSI, that is, a standby state.

For example, there is a product designed to temporarily stop operation until a time set by a timer and begin reproducing music or the like at the set time. A supply voltage is applied to the entire circuit of such a product at all times. While the product is in the standby state, only part of its circuit components such as the timer are in an operating state and the other circuit components forming most of the circuit are in the standby state in which their signal processing operation is stopped.

A circuit including circuit components being in such a standby state generally consumes less power than when all the circuit components of the circuit are in an operating state. Even in such a circuit, there is a leakage current flowing through the circuit components even in the standby state, and therefore power is constantly consumed.

FIG. 10 is a circuit diagram showing a standard inverter circuit as an example of a conventional transistor circuit.

The transistor circuit shown in FIG. 10 has a P-type transistor A and an N-type transistor B.

An input terminal (Input) is a portion where gates of the P-type transistor A and the N-type transistor B are connected to each other, whereas an output terminal (Output) is a portion where drains of the P-type transistor A and the N-type transistor B are connected to each other.

A supply voltage (Vdd) for the inverter circuit is supplied to a source of the P-type transistor A.

A source of the N-type transistor B is grounded.

The P-type transistor A and the N-type transistor B are short channel type transistors that have a very high signal propagation speed, but cause a leakage current (IL) at the time of non-standby operation.

Either a high potential equal to that on the Vdd side or a low potential equal to that on the ground side arrives at the input terminal (Input) as a signal. When the input terminal (Input) is at the high potential, the N-type (N channel type) transistor B is in an on state and the P-type (P channel type) transistor A is in an off state. Then, the low potential equal to that on the ground side is outputted to the output terminal (Output). On the other hand, when the input terminal (Input) is at the low potential, the P-type transistor A is in an on state and the N-type transistor B is in an off state. Then, the high potential equal to the voltage value (Vdd) is outputted to the output terminal (Output).

The leakage current (IL) in the inverter circuit shown in FIG. 10 is an unnecessary current that flows at all times through the interior of the transistors A and B connected between the Vdd side and the ground.

Since progress of LSI microfabrication techniques has lowered a withstand voltage value of a product circuit and also a supply voltage applied to the circuit, power consumption itself is on the decrease. Therefore, it may be said that a desirable environment is being formed for a product using a battery as its power supply.

On the other hand, the progress of LSI microfabrication techniques tends to increase leakage current (subthreshold current) and the like of the circuit and hence increase constant power consumption by the leakage current.

Incidentally, the input terminal (Input) in the standby state often exhibits a value intermediate between a value of the high potential and a value of the low potential, or an indefinite value.

Conventionally, in an LSI integrating transistors having a channel length of 0.35 $\mu$m or more, the leakage current of the transistors is so low as to be negligible. Therefore, the amount of constant power consumption by the leakage current of the transistors in the standby state does not present much of a problem.

However, the channel length of a MOS type transistor in an LSI has recently become 0.2 $\mu$m or less, and is expected to become increasingly less in the future.

Thus, it has been urgently necessary to solve the problem of constant power consumption by the leakage current.

Since the input terminal (Input) shown in FIG. 10 in the conventional LSI in the standby state often exhibits a value intermediate between a value of the high potential and a value of the low potential, or an indefinite value, an unstable through current flows through the transistors A and B in the standby state. Thus, the unstable through current also unnecessarily consumes power.

SUMMARY OF THE INVENTION

The present invention has been made in view of the above problems in the conventional transistor circuit, and it is accordingly an object of the present invention to provide a transistor circuit that can reduce unnecessary power consumption caused by the leakage current and the like during standby.

In order to solve the above problems, according to the present invention, there is provided a transistor circuit which uses a MOS transistor and stands by in a state of being supplied with a supply voltage, the transistor circuit comprising: a main circuit including one or more input terminals, one or more output terminals, one or more power supply-side terminals, and one or more MOS transistors; a P-type transistor; and an N-type transistor; wherein a supply voltage identical with the supply voltage supplied to the main circuit is applied to a source of the P-type transistor; a gate of the P-type transistor and a gate of the N-type transistor are connected to an enable terminal for on-off control of operation of the main circuit; a drain of the P-type transistor is connected to at least one output terminal of the main circuit; a drain of the N-type transistor is connected to at least one ground-side terminal of the main circuit; a source of the N-type transistor is grounded; and a channel of the N-type transistor is formed so as to be longer than a channel of the MOS transistor included in the main circuit.

Also, there is provided a transistor circuit which uses a MOS transistor and stands by in a state of being supplied with a supply voltage, the transistor circuit comprising: a main circuit including one or more input terminals, one or more output terminals, one or more power supply-side terminals, and one or more MOS transistors; a P-type transistor; and an N-type transistor; wherein the supply voltage to be supplied to the main circuit is applied to a source of the P-type transistor; a drain of the P-type transistor is connected to at least one power supply-side terminal of the main circuit; a gate of the P-type transistor and a gate of the N-type transistor are connected to an enable terminal for on-off control of operation of the main circuit; a drain of the N-type transistor is connected to at least one output terminal of the main circuit; at least one ground-side terminal of the main circuit and a source of the N-type transistor are grounded; and a channel of the P-type transistor is formed so as to be longer than a channel of the MOS transistor included in the main circuit.

In addition, there is provided a transistor circuit which uses a MOS transistor and stands by in a state of being supplied with a supply voltage, the transistor circuit comprising: one or more logical circuits having a portion where a gate of a P-type transistor and a gate of a first N-type transistor are connected to each other as an input terminal, and having a portion where a drain of the P-type transistor and a drain of the first N-type transistor are connected to each other as an output terminal, the supply voltage being applied to a source of the P-type transistor; and a second N-type transistor having a drain connected to a source of the first N-type transistor of one arbitrary logical circuit, a source connected to a ground, a gate as an enable terminal for on-off control of operation of the logical circuit, and a channel formed so as to be longer than a channel of the first N-type transistor.

In addition, there is provided a transistor circuit which uses a MOS transistor and stands by in a state of being supplied with a supply voltage, the transistor circuit comprising: one or more logical circuits having a portion where a gate of a first P-type transistor and a gate of a first N-type transistor are connected to each other as an input terminal, and having a portion where a drain of the first P-type transistor and a drain of the first N-type transistor are connected to each other as an output terminal, the supply voltage being applied to a source of the first P-type transistor; a second N-type transistor having a drain connected to a source of the first N-type transistor of one arbitrary logical circuit, a source connected to a ground, a gate as an enable terminal for on-off control of operation of the logical circuit, and a channel formed so as to be longer than a channel of the first N-type transistor; and a second P-type transistor having a source supplied with the supply voltage, a drain connected to the output terminal, and a gate connected to the enable terminal.

Moreover, there is provided a transistor circuit which uses a MOS transistor and stands by in a state of being supplied with a supply voltage, the transistor circuit comprising: one or more logical circuits having a portion where a gate of a first P-type transistor and a gate of an N-type transistor are connected to each other as an input terminal, and having a portion where a drain of the first P-type transistor and a drain of the N-type transistor are connected to each other as an output terminal, a source of the N-type transistor being grounded; and a second P-type transistor having a drain connected to a source of the first P-type transistor of one arbitrary logical circuit, a source supplied with the supply voltage, a gate as an enable terminal for on-off control of operation of the logical circuit, and a channel formed so as to be longer than a channel of the first P-type transistor.

Moreover, there is provided a transistor circuit which uses a MOS transistor and stands by in a state of being supplied with a supply voltage, the transistor circuit comprising: one or more logical circuits having a portion where a gate of a first P-type transistor and a gate of a first N-type transistor are connected to each other as an input terminal, and having a portion where a drain of the first P-type transistor and a drain of the first N-type transistor are connected to each other as an output terminal, a source of the first N-type transistor being grounded; a second P-type transistor having a drain connected to a source of the first P-type transistor of one arbitrary logical circuit, a source supplied with the supply voltage, a gate as an enable terminal for on-off control of operation of the logical circuit, and a channel formed so as to be longer than a channel of the first P-type transistor; and a second N-type transistor having a source connected to a ground, a drain connected to the output terminal, and a gate connected to the enable terminal.

Furthermore, there is provided a transistor circuit which uses a MOS transistor and stands by in a state of being supplied with a supply voltage, the transistor circuit comprising: one or more logical circuits having a portion where a gate of a first P-type transistor and a gate of a first N-type transistor are connected to each other as a first input terminal, having a portion where a gate of a second P-type transistor and a gate of a second N-type transistor are connected to each other as a second input terminal, and having a portion where a drain of the first P-type transistor, a drain of the second P-type transistor, and a drain of the first N-type transistor are connected to each other as an output terminal, the supply voltage being applied to a source of the first P-type transistor and a source of the second P-type transistor, and a source of the first N-type transistor being connected to a drain of the second N-type transistor; a third N-type transistor having a drain connected to a source of the second N-type transistor of one arbitrary logical circuit, a source connected to a ground, a gate as an enable terminal for on-off control of operation of the logical circuit, and a channel formed so as to be longer than a channel of the first N-type transistor and a channel of the second N-type transistor; and a third P-type transistor having a source supplied with the supply voltage, a drain connected to the output terminal, and a gate connected to the enable terminal.

Furthermore, there is provided a transistor circuit which uses a MOS transistor and stands by in a state of being supplied with a supply voltage, the transistor circuit comprising: one or more logical circuits having a portion where a gate of a first P-type transistor and a gate of a first N-type transistor are connected to each other as a second input terminal, having a portion where a gate of a second P-type transistor and a gate of a second N-type transistor are connected to each other as a first input terminal, and having a portion where a drain of the first N-type transistor, a drain of the second N-type transistor, and a drain of the second P-type transistor are connected to each other as an output terminal, the supply voltage being applied to a source of the first P-type transistor, a drain of the first P-type transistor being connected to a source of the second P-type transistor, and a source of the first N-type transistor being connected to a source of the second N-type transistor; a third N-type transistor having a drain connected to the source of the first N-type transistor and the source of the second N-type transistor of one arbitrary logical circuit, a source connected to a ground, a gate as an enable terminal for on-off control of operation of the logical circuit, and a channel formed so as to be longer than a channel of the first N-type transistor and a channel of the second N-type transistor; and a third P-type transistor having a source supplied with the supply voltage, a drain connected to the output terminal, and a gate connected to the enable terminal.

Thus, according to the present invention, in a transistor circuit including a logical unit using a type of MOS transistor that stands by in a state of being supplied with supply voltage, a MOS transistor for interrupting leakage current that has a channel length longer than that of the MOS transistor used in a plurality of logical circuits (more specifically, inverter circuits or the like) is placed so as to be connected in series with the logical circuits (between the supply voltage and a ground). The MOS transistor for interrupting leakage current conducts only while the transistor circuit is operated and does not conduct while the transistor circuit is in a standby state. Therefore, it is possible to reduce unnecessary power consumption by the leakage current of the logical circuits (between the supply voltage and the ground).

In addition, the transistor circuit includes a MOS transistor that does not produce effect while the transistor circuit is operated and makes the potential of an output terminal a high potential or a low potential (not intermediate potential) only while the transistor circuit is in a standby state. Therefore, it is also possible to reduce unnecessary power consumption by through-transistor current of a standby type circuit in a succeeding stage.

DETAILED DESCRIPTION OF THE PREFERRED EMBODIMENTS

Preferred embodiments of the present invention will hereinafter be described with reference to the drawings.
(First Embodiment)

Figure 1:
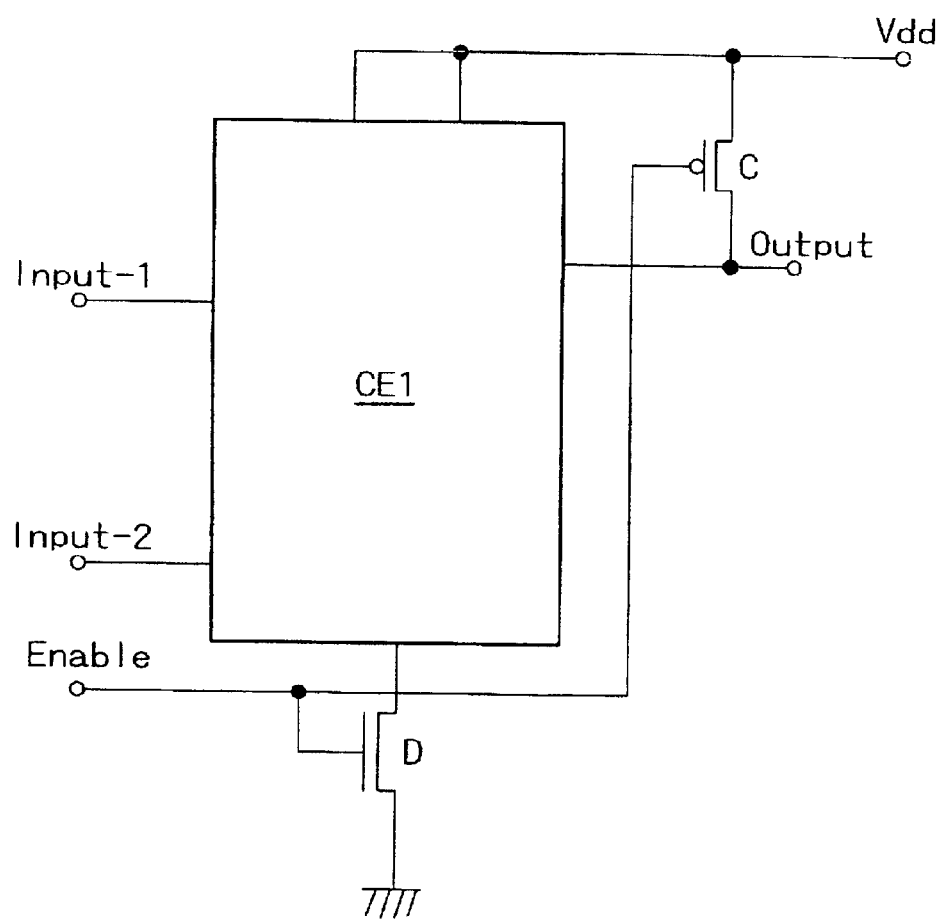
FIG. 1 is a circuit diagram showing circuit configuration of a transistor circuit according to a first embodiment of the present invention.

FIG. 1 is a circuit diagram showing a circuit configuration of a transistor circuit according to a first embodiment of the present invention.

The transistor circuit according to the first embodiment has a cell (CE1) (main circuit) including a MOS-FET (Metal Oxide Semiconductor) transistor, a P-type transistor C, and an N-type transistor D having a function of interrupting leakage current.

In this case, each of the P-type transistor C and the N-type transistor D is a MOS-FET.

A supply voltage (Vdd) of the cell (CE1) is applied to a source of the P-type transistor C. A drain of the P-type transistor C is connected to an output terminal (Output) of the cell (CE1), while a gate of the P-type transistor C is connected to a gate of the N-type transistor D and an enable terminal (Enable), which will be described later.

A drain of the N-type transistor D is connected to a ground-side terminal of the cell (CE1), while a source of the N-type transistor D is grounded.

The cell (CE1) is a circuit including a short channel type MOS transistor.

Figure 10:
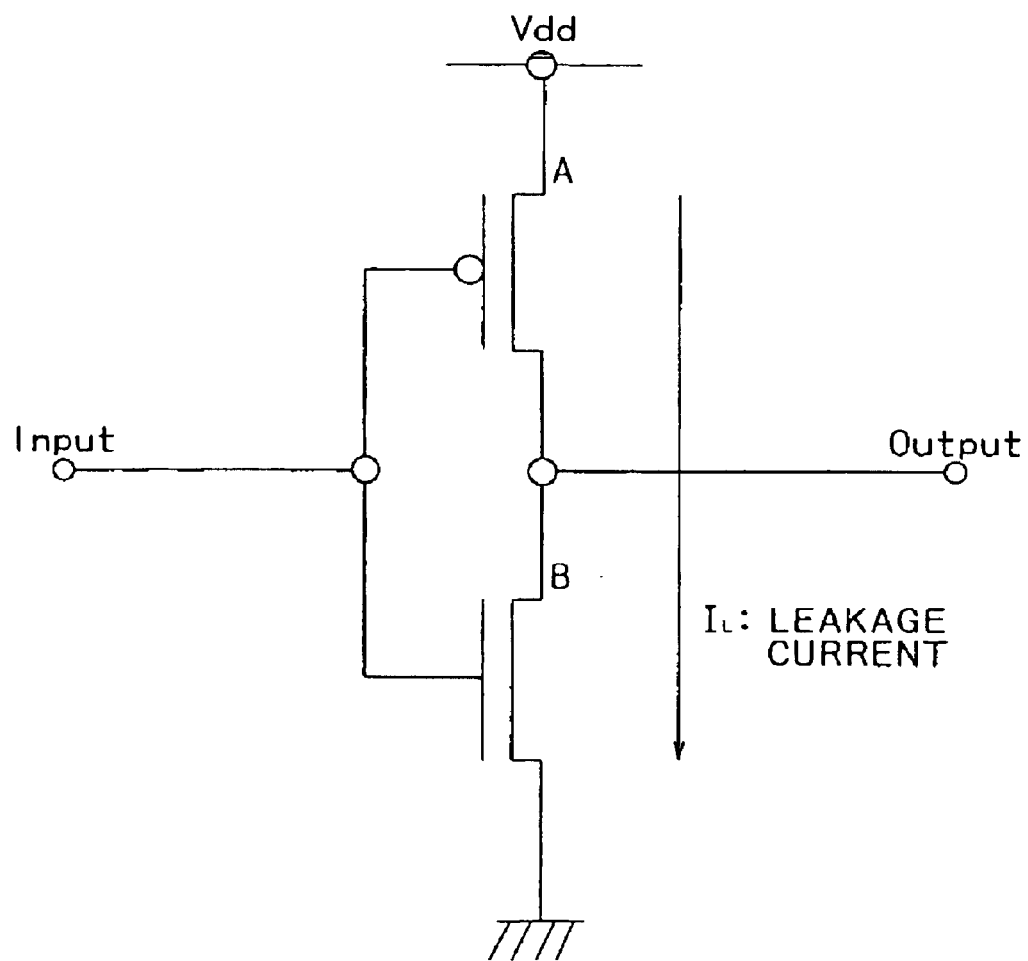
FIG. 10 is a circuit diagram showing a standard inverter circuit as an example of a conventional transistor circuit.

The short channel type MOS transistor has a very high signal propagation speed, but causes a leakage current (IL) as shown in FIG. 10 at the time of non-standby operation. The leakage current (IL) is caused also in a standby state if no measures are provided against it. The first embodiment prevents the leakage current by operating principles to be described later.

The N-type transistor D is formed such that channel length of the N-type transistor D is sufficiently longer than that of the short channel type MOS transistor included in the cell (CE1).

The cell (CE1) allows a column connection of a plurality of MOS transistors (which functions as an amplifier). In that case, the drain of the N-type transistor D having a function of interrupting leakage current can be connected to either one of the transistors via the corresponding ground-side terminal.

Operating principles of the transistor circuit according to the first embodiment will be described in the following.

When the transistor circuit according to the first embodiment is to be brought into an operating state, a high potential equal to the supply voltage (Vdd) is applied to the enable terminal (Enable).

When the transistor circuit is brought into the operating state, that is, when the high potential equal to the supply voltage (Vdd) is applied to the enable terminal (Enable), the P-type transistor C is brought into an off state, or a non-conducting state, and thus produces no effect on the output terminal (Output).

The N-type transistor D is brought into an on state, or a conducting state, and therefore the ground-side terminal of the cell (CE1) is brought into a grounded state. Thus, the cell (CE1) becomes a circuit equivalent to for example a NAND circuit shown in FIG. 2 to be described later or a conventional inverter circuit shown in FIG. 10.

In this case, either a high potential equal to that on the Vdd side or a low potential equal to that on the ground side arrives at an input terminal (Input) of the circuit as a signal. The cell (CE1) performs a predetermined operation on the signal, and then outputs the result to the output terminal (Output).

When the transistor circuit according to the first embodiment is brought into a standby state, the enable terminal (Enable) is set to the low potential equal to the ground-side potential.

When the transistor circuit is brought into the standby state, that is, when the enable terminal (Enable) is set to the low potential equal to the ground-side potential, the P-type transistor C is brought into an on state, or a conducting state, and the output terminal (Output) is set to the high potential equal to that on the Vdd side. Thus, the supply voltage (Vdd) of the high potential necessary for a circuit component in a succeeding stage (not shown) is applied to the output terminal (Output).

In this case, the N-type transistor D is brought into an off state, or a non-conducting state, and the cell (CE1) becomes inoperable. Also, since the channel length of the N-type transistor D is sufficiently longer than that of the short channel type MOS transistor used in the cell (CE1), the leakage current (IL) as shown in FIG. 10 is interrupted.

It is to be noted that the first embodiment can be used for a type of circuit component in a succeeding stage that stands by while being supplied with power and requires in the standby state that the input terminal (Input) be at the high potential equal to that on the Vdd side.

Also, the input terminal (Input) of the cell (CE1) in the first embodiment shown in FIG. 1 is formed by two terminals denoted by references Input-1 and Input-2; however, the cell (CE1) can generally be provided with an arbitrary number of input terminals.

In addition, as for the output terminal (Output), a power (Vdd)-side terminal, and the ground-side terminal of the cell (CE1), the cell (CE1) can generally be provided with arbitrary numbers of such terminals (the power (Vdd)-side terminal in the first embodiment is also formed by two terminals).

Furthermore, the P-type transistor C is optional, and therefore may be omitted.

Figure 2:
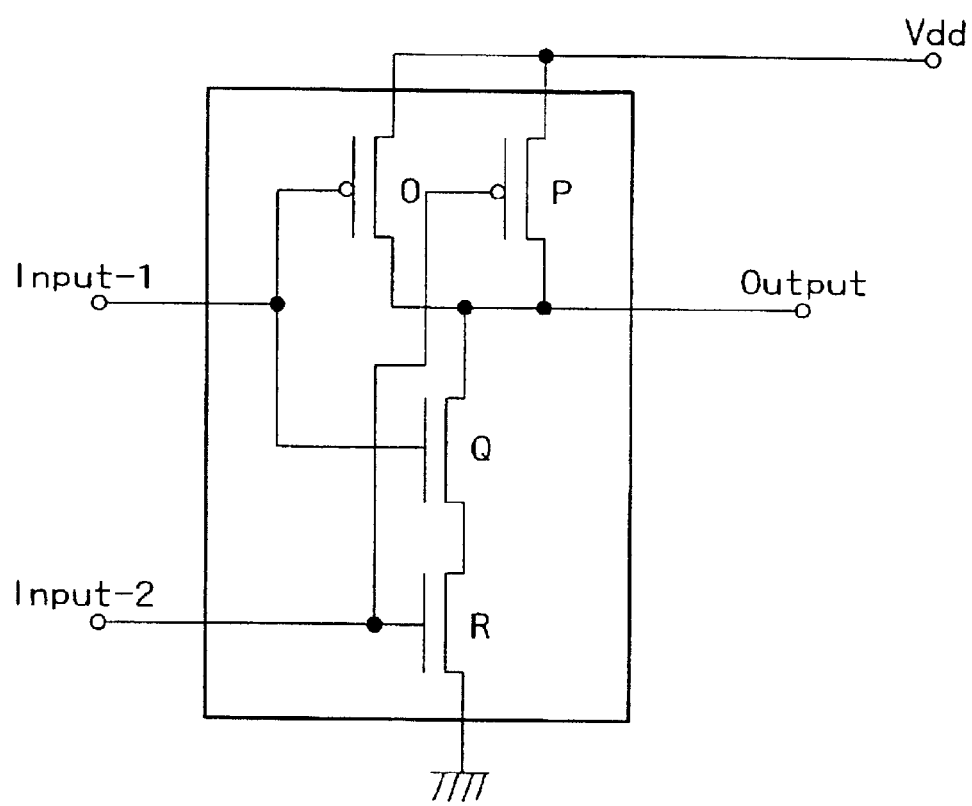
FIG. 2 is a circuit diagram showing a circuit configuration of a typical cell of the transistor circuit according to the first embodiment of the present invention.

FIG. 2 is a circuit diagram showing a circuit configuration of a typical cell of the transistor circuit according to the first embodiment of the present invention.

The cell circuit shown in FIG. 2 includes: P-type transistors O and P connected in parallel with each other and having sources supplied with power (Vdd), drains connected to the output terminal (Output), and gates connected with the input terminals (Input-1) and (Input-2), respectively; an N-type transistor Q having a drain connected to the output terminal (Output), a source connected to a drain of an N-type transistor R to be described below, and a gate connected to the input terminal (Input-1); and an N-type transistor R having a drain connected to the source of the N-type transistor Q, a source connected to the ground, and a gate connected to the input terminal (Input-2).

The cell circuit shown in FIG. 2 performs an operation as a NAND circuit (NAND gate) on signals inputted to the input terminals (Input-1) and (Input-2), and then outputs the result of the operation to the output terminal (Output).

(Second Embodiment)

Figure 3:
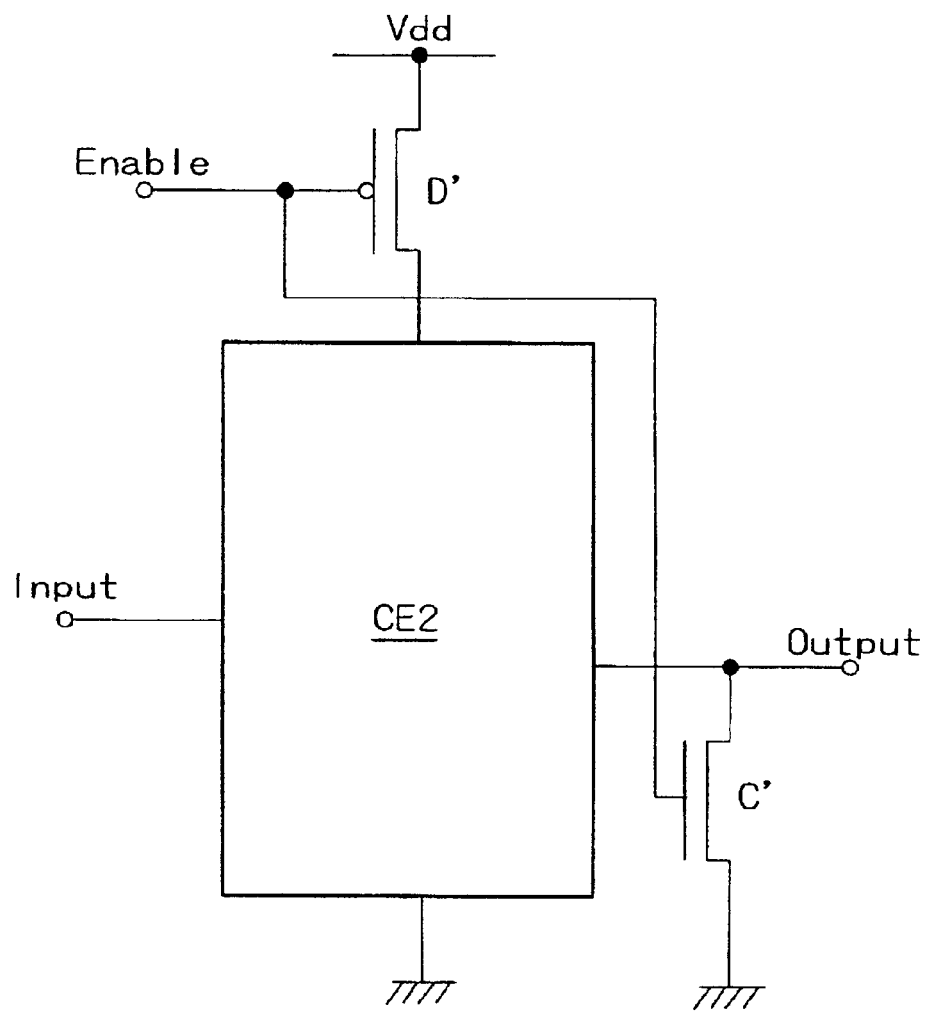
FIG. 3 is a circuit diagram showing circuit configuration of a transistor circuit according to a second embodiment of the present invention.

FIG. 3 is a circuit diagram showing a circuit configuration of a transistor circuit according to a second embodiment of the present invention.

The transistor circuit according to the second embodiment has a cell (CE2) (main circuit) including a MOS-FET transistor, an N-type transistor C' having a function of interrupting leakage current, and a P-type transistor D'.

In this case, each of the N-type transistor C' and the P-type transistor D' is a MOS-FET.

A drain of the N-type transistor C' is connected to an output terminal (Output), while a source of the N-type transistor C' is grounded.

A source of the P-type transistor D' is connected to power (Vdd), while a drain of the P-type transistor D' is connected to a power-side terminal of the cell (CE2).

Gates of the N-type transistor C' and the P-type transistor D' are connected to an inverted enable terminal (Enable-bar)

The P-type transistor D' is formed such that channel length of the P-type transistor D' is sufficiently longer than that of a short channel type MOS transistor included in the cell (CE2).

Operating principles of the transistor circuit according to the second embodiment will be described in the following.

When the transistor circuit according to the second embodiment is to be brought into an operating state rather than a standby state, the inverted enable terminal (Enable-bar) is set to a low potential equal to a ground-side potential.

When the transistor circuit is brought into the operating state, that is, when the inverted enable terminal (Enable-bar) is set to the low potential equal to the ground-side potential, the N-type transistor C' is brought into an off state, or a non-conducting state, and thus produces no effect on the output terminal (Output).

The P-type transistor D' is brought into an on state, or a conducting state, and therefore a supply voltage (Vdd) is supplied to the cell (CE2). Thus, the cell (CE2) becomes a circuit equivalent to for example the NAND circuit shown in FIG. 2 or the inverter circuit shown in FIG. 10.

In this case, either a high potential equal to that on the Vdd side or the low potential equal to that on the ground side arrives at an input terminal (Input) of the circuit as a signal. The cell (CE2) performs a predetermined operation on the signal, and then outputs the result to the output terminal (Output).

When the transistor circuit according to the second embodiment is brought into a standby state, the inverted enable terminal (Enable-bar) is set to the high potential equal to the Vdd-side potential.

When the transistor circuit is brought into the standby state, that is, when the inverted enable terminal (Enable-bar) is set to the high potential equal to the Vdd-side potential, the N-type transistor C' is brought into an on state, or a conducting state, and the output terminal (Output) is set to the same potential as that on the ground side. Thus, the output terminal (Output) is at the low potential necessary for a circuit component in a succeeding stage (not shown).

In this case, the P-type transistor D' is brought into an off state, or a non-conducting state, and the cell (CE2) becomes inoperable. Also, since the channel length of the P-type transistor D' is sufficiently longer than that of a P-type transistor A and an N-type transistor B, the leakage current (IL) as shown in FIG. 10 is interrupted.

It is to be noted that the second embodiment can be used for a type of circuit component in a succeeding stage that stands by while being supplied with power and requires in the standby state that the input terminal be at the low potential equal to that on the ground side.

Also, the input terminal (Input) of the cell (CE2) in the second embodiment is formed by one terminal; however, the cell (CE2) can generally be provided with an arbitrary number of input terminals.

In addition, as for the output terminal (Output), the power (Vdd)-side terminal, and the ground-side terminal of the cell (CE2), the cell (CE2) can generally be provided with arbitrary numbers of such terminals (the power (Vdd)-side terminal in the second embodiment is formed by only one terminal connected to the drain of the P-type transistor D').

Furthermore, the N-type transistor C' is optional, and therefore may be omitted.

(Third Embodiment)

Figure 4:
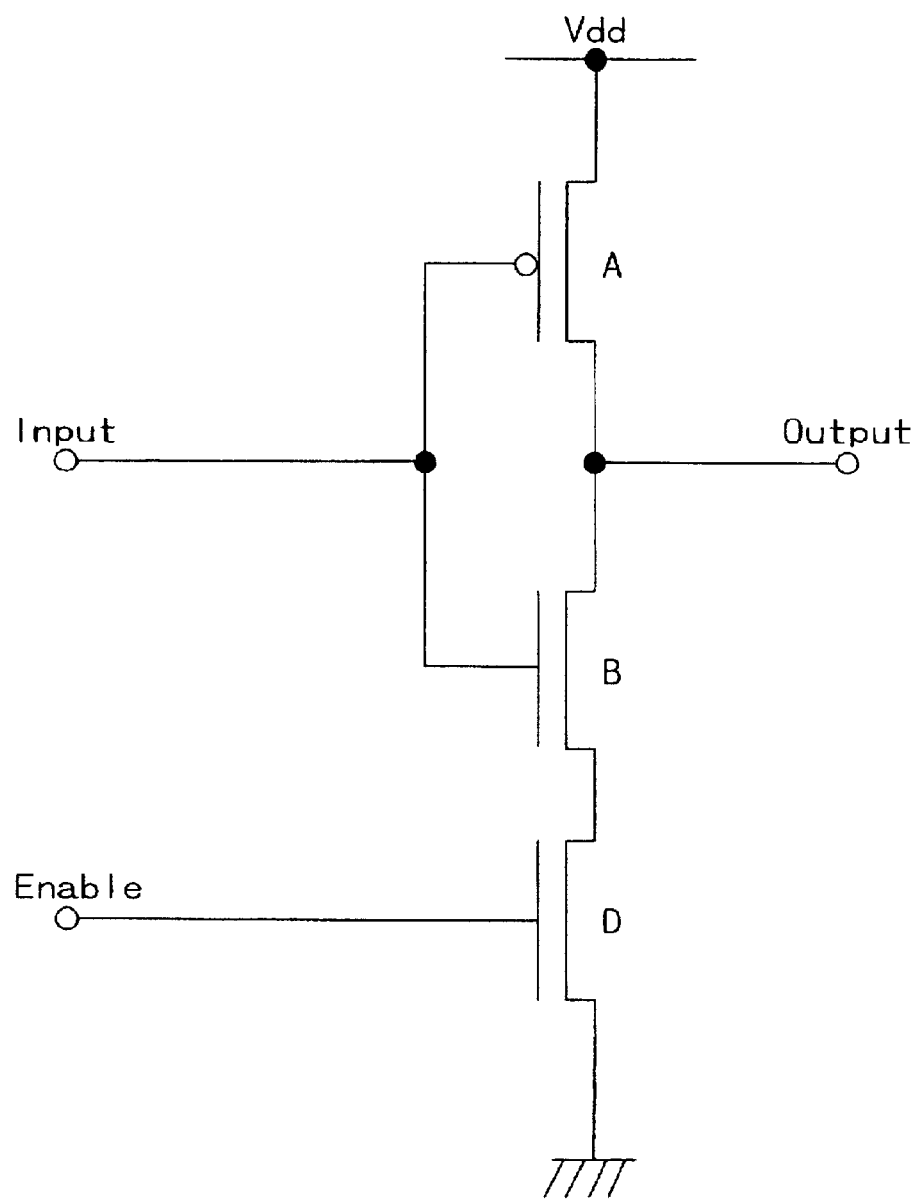
FIG. 4 is a circuit diagram showing circuit configuration of a transistor circuit according to a third embodiment of the present invention.

FIG. 4 is a circuit diagram showing circuit configuration of a transistor circuit according to a third embodiment of the present invention.

The transistor circuit according to the third embodiment has a P-type transistor A and an N-type transistor B forming an inverter unit and an N-type transistor D having a function of interrupting leakage current.

In this case, each of the P-type transistor A, the N-type transistor B, and the N-type transistor D is a MOS-FET.

An input terminal (Input) of the inverter unit is a portion where gates of the P-type transistor A and the N-type transistor B are connected to each other, whereas an output terminal (Output) of the inverter unit is a portion where drains of the P-type transistor A and the N-type transistor B are connected to each other.

A supply voltage (Vdd) for the inverter unit is supplied to a source of the P-type transistor A.

A source of the N-type transistor B is connected to a drain of the N-type transistor D, and a source of the N-type transistor D is grounded.

The P-type transistor A and the N-type transistor B are short channel type transistors that have a very high signal propagation speed, but cause a leakage current (IL) as shown in FIG. 10 at the time of non-standby operation. The leakage current (IL) is caused also in a standby state if no measures are provided against it. The third embodiment prevents the leakage current by operating principles to be described later.

The N-type transistor D is formed such that channel length of the N-type transistor D is sufficiently longer than that of each of the P-type transistor A and the N-type transistor B.

A column connection of a plurality of inverter units is possible (this connection functions as an amplifier). In that case, the N-type transistor D having the function of interrupting leakage current can be connected to either one of the inverter units.

Operating principles of the transistor circuit according to the third embodiment will be described in the following.

When the transistor circuit according to the third embodiment is to be brought into an operating state rather than a standby state, a high potential equal to the supply voltage (Vdd) is applied to an enable terminal (Enable).

Thus, the N-type transistor D is brought into an on state, or a conducting state, and therefore the source of the N-type transistor B is brought into a grounded state. Thus, the inverter unit including the P-type transistor A and the N-type transistor B becomes a circuit equivalent to the conventional inverter circuit shown in FIG. 10.

Either the high potential equal to that on the Vdd side or a low potential equal to that on the ground side arrives at the input terminal (Input) of the circuit as a signal. When the input terminal (Input) is at the high potential, the N-type transistor B is in an on state and the P-type transistor A is in an off state. Then, the low potential equal to that on the ground side is outputted to the output terminal (Output). On the other hand, when the input terminal (Input) is at the low potential, the P-type transistor A is in an on state and the N-type transistor B is in an off state. Then, the high potential equal to the voltage value (Vdd) is outputted to the output terminal (Output).

When the transistor circuit according to the third embodiment is brought into a standby state, the enable terminal (Enable) is set to the low potential equal to the ground-side potential.

Thus, the N-type transistor D is brought into an off state, or a non-conducting state, and the inverter unit becomes inoperable. Also, since the channel length of the N-type transistor D is sufficiently longer than that of the P-type transistor A and the N-type transistor B, the leakage current (IL) as shown in FIG. 10 is interrupted.

(Fourth Embodiment)

Figure 5:
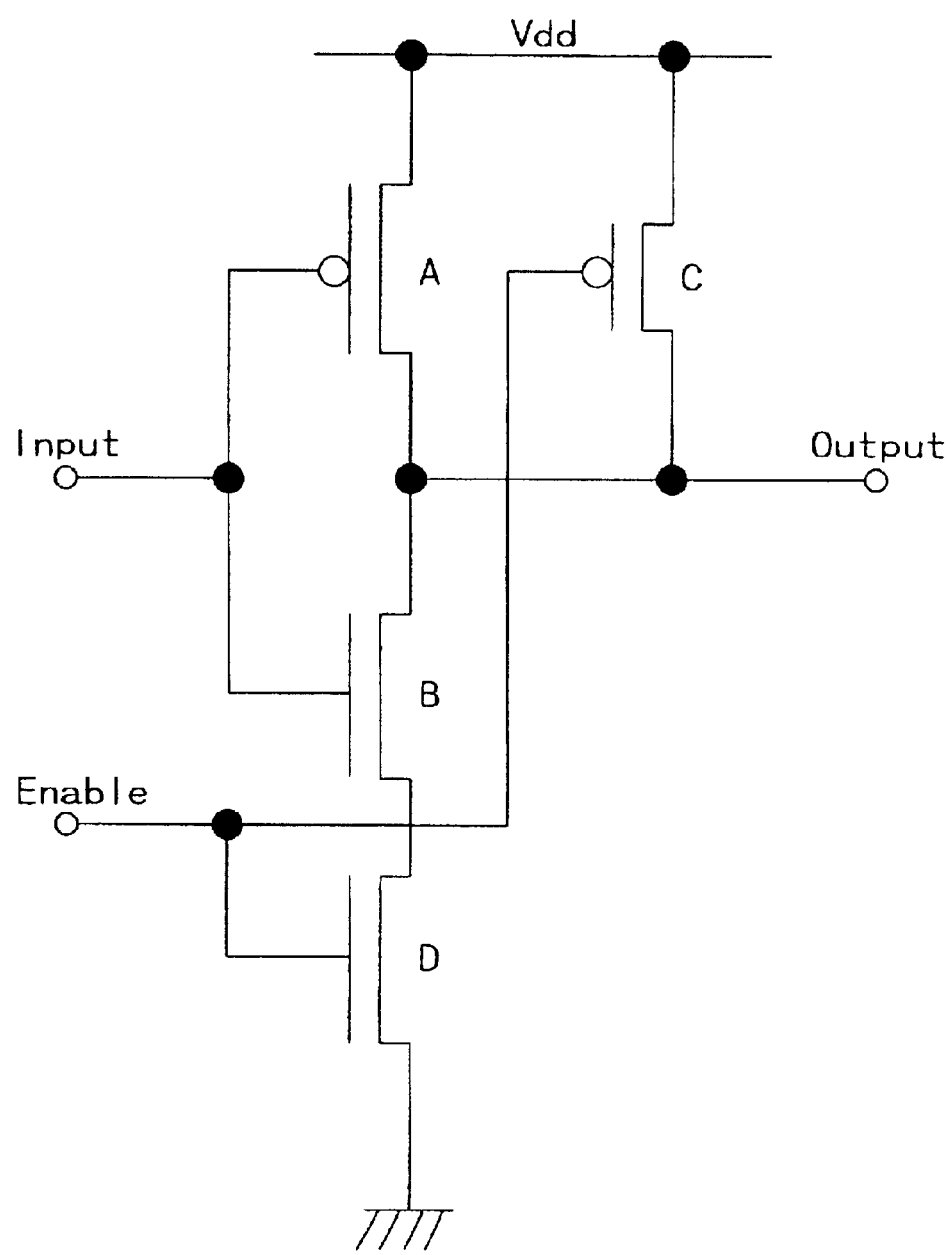
FIG. 5 is a circuit diagram showing circuit configuration of a transistor circuit according to a fourth embodiment of the present invention.

FIG. 5 is a circuit diagram showing a circuit configuration of a transistor circuit according to a fourth embodiment of the present invention.

As compared with the transistor circuit according to the third embodiment, the transistor circuit according to the fourth embodiment is the same as the transistor circuit according to the third embodiment except that a P-type transistor C is added to the transistor circuit according to the fourth embodiment.

In this case, the P-type transistor C is a MOS-FET.

A source of the P-type transistor C is connected to a supply voltage (Vdd) of an inverter unit, and a drain of the P-type transistor C is connected to an output terminal (Output).

A gate of the P-type transistor C is connected to an enable terminal (Enable).

An N-type transistor D is formed such that channel length of the N-type transistor D is sufficiently longer than that of each of a P-type transistor A and an N-type transistor B.

Operating principles of the transistor circuit according to the fourth embodiment will be described in the following.

Operation of the transistor circuit according to the fourth embodiment is equal to the above-described operation of the transistor circuit according to the third embodiment plus operation of the P-type transistor C.

When the transistor circuit is brought into an operating state, that is, when a high potential equal to the supply voltage (Vdd) is applied to the enable terminal (Enable), the P-type transistor C is brought into an off state, or a non-conducting state, and thus produces no effect on the output terminal (Output).

When the transistor circuit is brought into a standby state, that is, when the enable terminal (Enable) is set to the same potential as a ground-side potential, the P-type transistor C is brought into an on state, or a conducting state, and the output terminal (Output) is set to the high potential equal to that on the Vdd side. Thus, the supply voltage (Vdd) necessary for a circuit component in a succeeding stage (not shown) is applied to the output terminal (Output).

It is to be noted that the fourth embodiment can be used for a type of circuit component in a succeeding stage that stands by while being supplied with power and requires in the standby state that the input terminal be at the high potential equal to that on the Vdd side.

(Fifth Embodiment)

Figure 6:
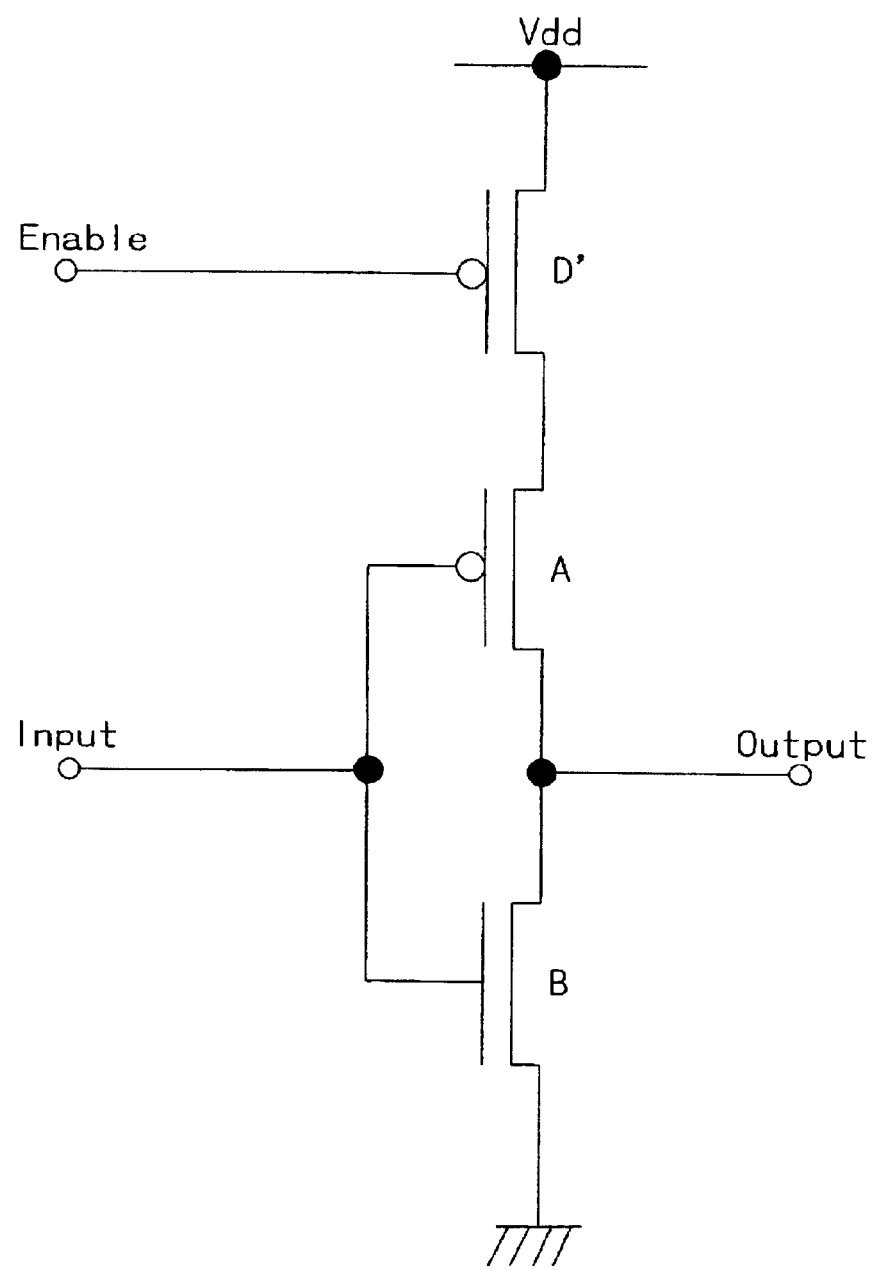
FIG. 6 is a circuit diagram showing circuit configuration of a transistor circuit according to a fifth embodiment of the present invention.

FIG. 6 is a circuit diagram showing a circuit configuration of a transistor circuit according to a fifth embodiment of the present invention.

The transistor circuit according to the fifth embodiment has a P-type transistor A and an N-type transistor B forming an inverter unit and a P-type transistor D' having a function of interrupting leakage current.

In this case, each of the P-type transistor A, the N-type transistor B, and the P-type transistor D' is a MOS-FET.

An input terminal (Input) of the inverter unit is a portion where gates of the P-type transistor A and the N-type transistor B are connected to each other, whereas an output terminal (Output) of the inverter unit is a portion where drains of the P-type transistor A and the N-type transistor B are connected to each other.

A supply voltage (Vdd) for the inverter unit is supplied to a source of the P-type transistor D', and a drain of the P-type transistor D' is connected to a source of the P-type transistor A.

A source of the N-type transistor B is grounded.

The P-type transistor A and the N-type transistor B are short channel type transistors that have a very high signal propagation speed, but cause a leakage current (IL) as shown in FIG. 10 at the time of non-standby operation. The leakage current (IL) is caused also in a standby state if no measures are provided against it. The fifth embodiment prevents the leakage current by operating principles to be described later.

The P-type transistor D' is formed such that channel length of the P-type transistor D' is sufficiently longer than that of each of the P-type transistor A and the N-type transistor B.

A column connection of a plurality of inverter units is possible (this connection functions as an amplifier). In that case, the P-type transistor D' having the function of interrupting leakage current can be disposed between either one of the inverter units and the Vdd side.

Operating principles of the transistor circuit according to the fifth embodiment will be described in the following.

When the transistor circuit according to the fifth embodiment is to be brought into an operating state rather than a standby state, an inverted enable terminal (Enable-bar) is set to a low potential equal to a ground-side potential.

Thus, the P-type transistor D' is brought into an on state, or a conducting state, and therefore the supply voltage (Vdd) is applied to the source of the P-type transistor A. Thus, the inverter unit including the P-type transistor A and the N-type transistor B becomes a circuit equivalent to the inverter circuit shown in FIG. 10.

Either a high potential equal to that on the Vdd side or the low potential equal to that on the ground side arrives at the input terminal (Input) of the circuit as a signal. When the input terminal (Input) is at the high potential, the N-type transistor B is in an on state and the P-type transistor A is in an off state. Then, the low potential equal to that on the ground side is outputted to the output terminal (Output). On the other hand, when the input terminal (Input) is at the low potential, the P-type transistor A is in an on state and the N-type transistor B is in an off state. Then, the high potential equal to the voltage value (Vdd) is outputted to the output terminal (Output).

When the transistor circuit according to the fifth embodiment is brought into a standby state, the inverted enable terminal (Enable-bar) is set to the high potential equal to the Vdd-side potential.

Thus, the P-type transistor D' is brought into an off state, or a non-conducting state, and the inverter unit becomes inoperable. Also, since the channel length of the P-type transistor D' is sufficiently longer than that of the P-type transistor A and the N-type transistor B, the leakage current (IL) as shown in FIG. 10 is interrupted.

(Sixth Embodiment)

Figure 7:
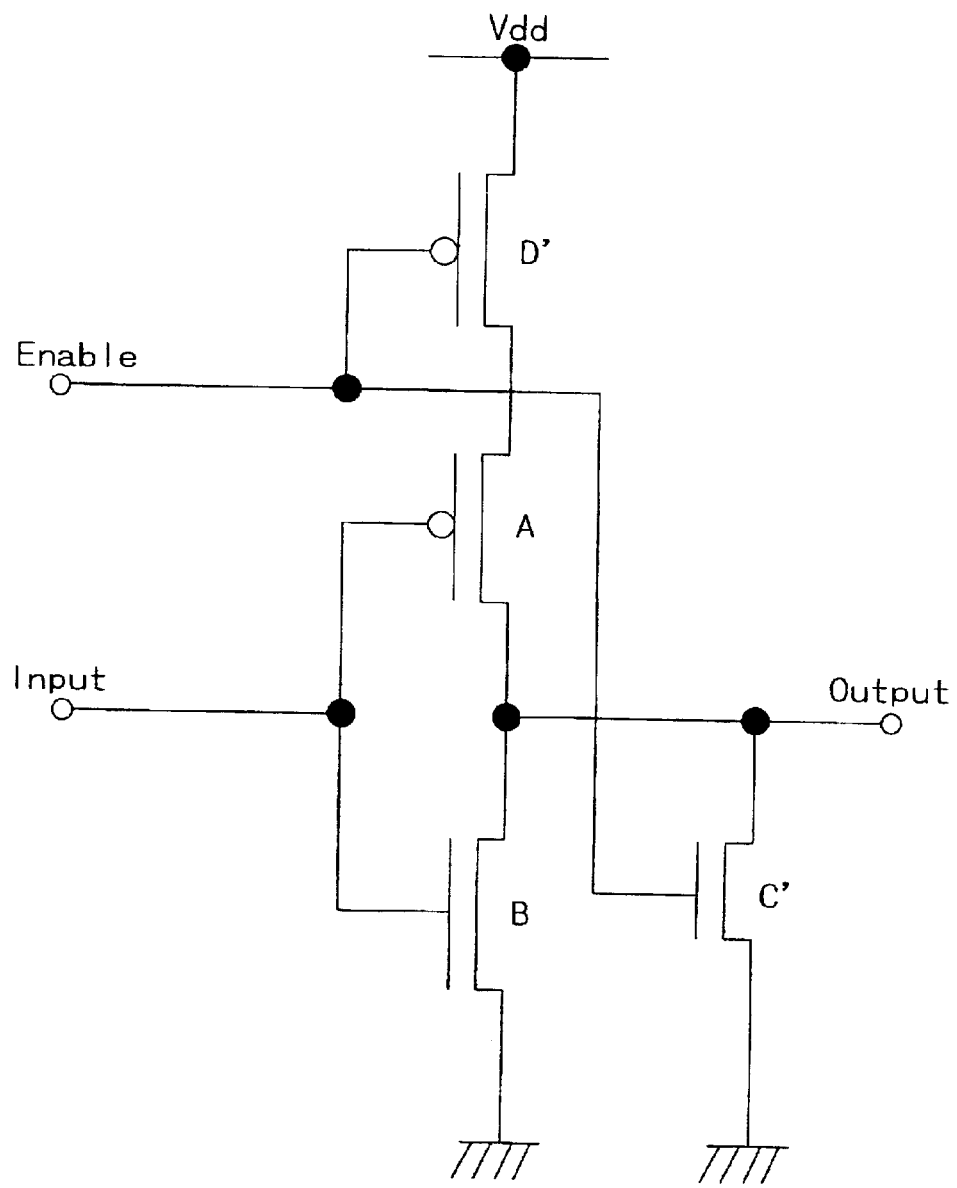
FIG. 7 is a circuit diagram showing circuit configuration of a transistor circuit according to a sixth embodiment of the present invention.

FIG. 7 is a circuit diagram showing a circuit configuration of a transistor circuit according to a sixth embodiment of the present invention.

As compared with the transistor circuit according to the fifth embodiment, the transistor circuit according to the sixth embodiment is the same as the transistor circuit according to the fifth embodiment except that an N-type transistor C' is added to the transistor circuit according to the sixth embodiment.

In this case, the N-type transistor C' is a MOS-FET.

A drain of the N-type transistor C' is connected to an output terminal (Output), and a source of the N-type transistor C' is grounded.

Gates of the N-type transistor C' and a P-type transistor D' are connected to an inverted enable terminal (Enable-bar).

The P-type transistor D' is formed such that channel length of the P-type transistor D' is sufficiently longer than that of each of a P-type transistor A and an N-type transistor B.

Operating principles of the transistor circuit according to the sixth embodiment will be described in the following.

Operation of the transistor circuit according to the sixth embodiment is equal to the above-described operation of the transistor circuit according to the fifth embodiment plus operation of the N-type transistor C'.

When the transistor circuit is brought into an operating state, that is, when the inverted enable terminal (Enable-bar) is set to a low potential equal to a ground-side potential, the N-type transistor C' is brought into an off state, or a non-conducting state, and thus produces no effect on the output terminal (Output).

When the transistor circuit is brought into a standby state, that is, when the inverted enable terminal (Enable-bar) is set to a high potential equal to that on the Vdd side, the N-type transistor C' is brought into an on state, or a conducting state, and the output terminal (Output) is set to the same potential as that on the ground side. Thus, the output terminal (Output) is at the low potential necessary for a circuit component in a succeeding stage (not shown).

The sixth embodiment can be used for a type of circuit component in a succeeding stage that stands by while being supplied with power and requires in the standby state that the input terminal be at the low potential equal to that on the ground side.

(Seventh Embodiment)

Figure 8:
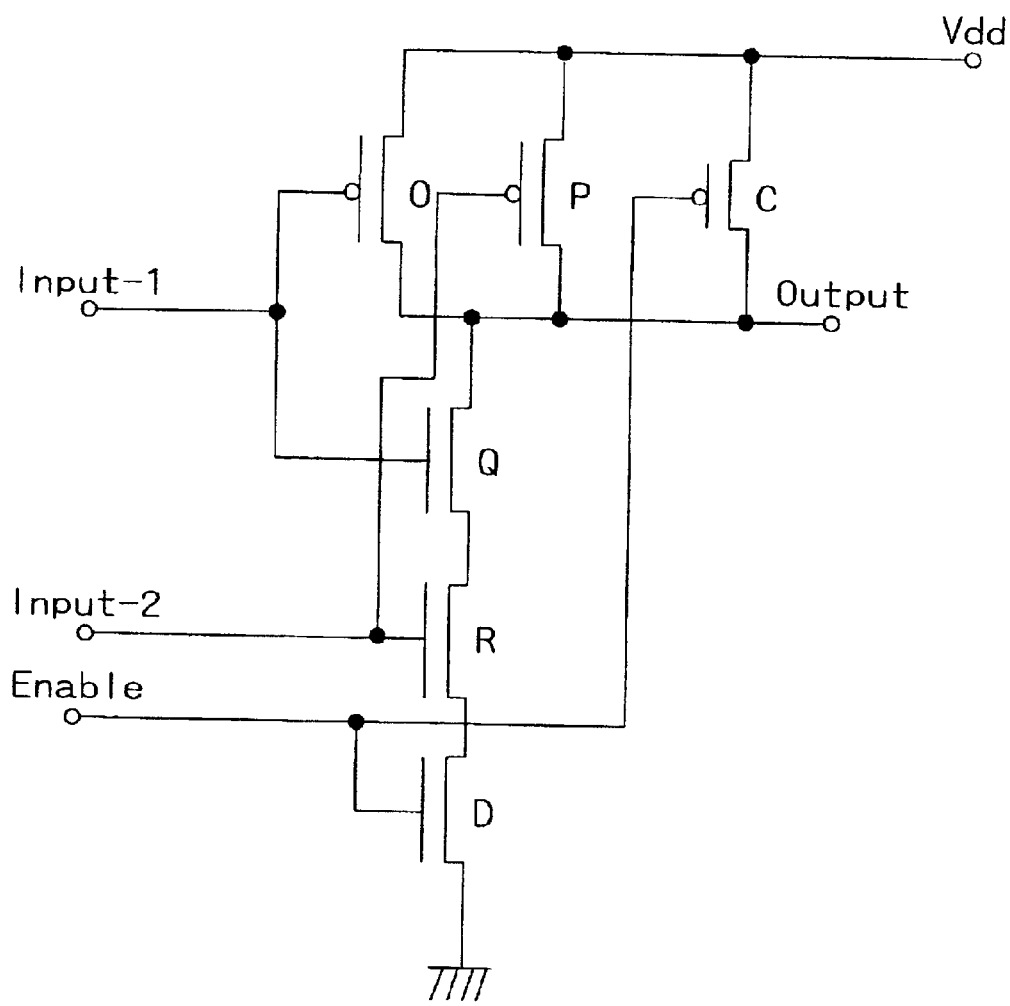
FIG. 8 is a circuit diagram showing circuit configuration of a transistor circuit according to a seventh embodiment of the present invention.

FIG. 8 is a circuit diagram showing a circuit configuration of a transistor circuit according to a seventh embodiment of the present invention.

The transistor circuit according to the seventh embodiment has a circuit configuration formed by replacing the cell (CE1) of the transistor circuit according to the first embodiment of the present invention shown in FIG. 1 with the NAND circuit shown specifically in FIG. 2.

An N-type transistor D is formed such that channel length of the N-type transistor D is sufficiently longer than that of each of P-type transistors O and P and N-type transistors Q and R.

Hence, operation of the transistor circuit according to the seventh embodiment is equal to that obtained by replacing the cell (CE1) of the transistor circuit according to the first embodiment of the present invention shown in FIG. 1 with the NAND circuit shown in FIG. 2.

(Eighth Embodiment)

Figure 9:
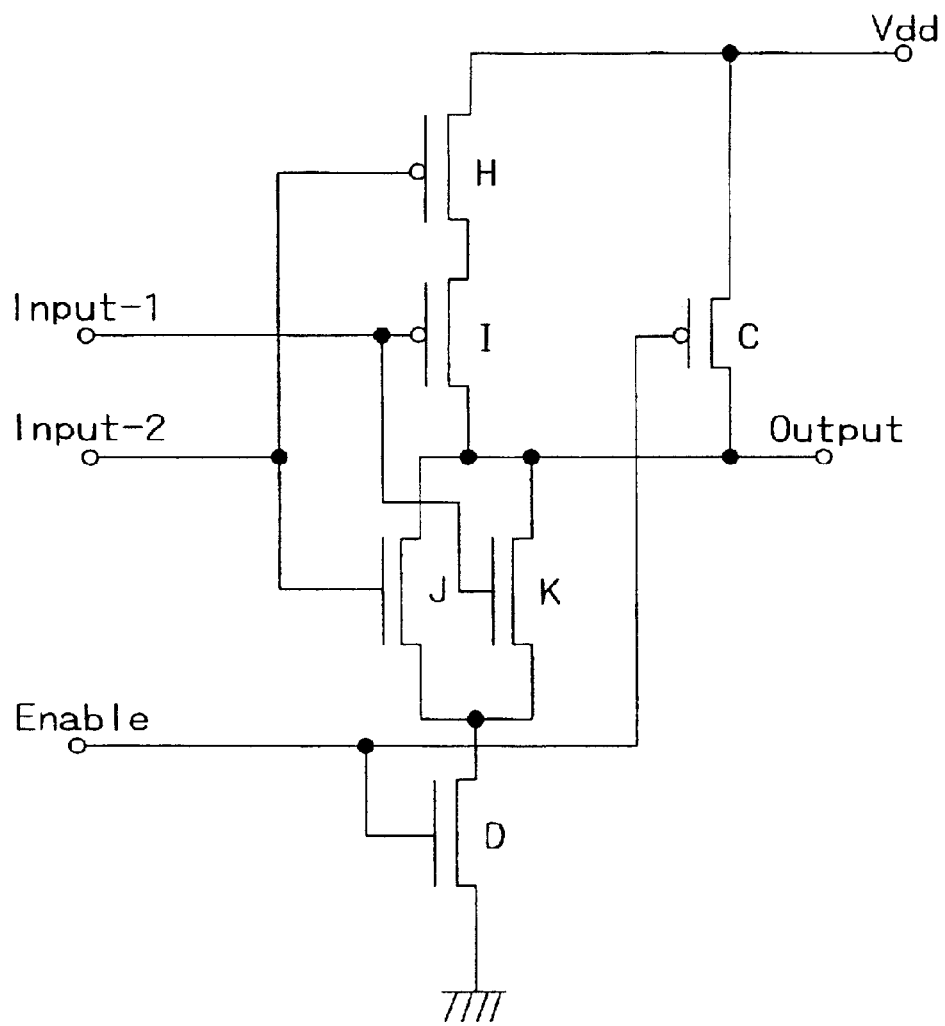
FIG. 9 is a circuit diagram showing circuit configuration of a transistor circuit according to an eighth embodiment of the present invention.

FIG. 9 is a circuit diagram showing a circuit configuration of a transistor circuit according to an eighth embodiment of the present invention.

The transistor circuit according to the eighth embodiment has a circuit configuration formed by replacing the cell (CE1) of the transistor circuit according to the first embodiment of the present invention shown in FIG. 1 with a NOR circuit.

Hence, operation of the transistor circuit according to the eighth embodiment is equal to that obtained by replacing the cell (CE1) of the transistor circuit according to the first embodiment of the present invention shown in FIG. 1 with the NOR circuit including N-type transistors J and K and P-type transistors H and I.

In this case, each of the transistors H, I, J, and K is a MOS-FET.

The P-type transistor H has a source connected to power (Vdd), a drain connected to a source of the succeeding P-type transistor I, and a gate connected to an input terminal (Input-2).

The P-type transistor I has the source connected to the drain of the P-type transistor H, a drain connected to an output terminal (output), and a gate connected to an input terminal (Input-1).

The N-type transistor J has a drain connected to the output terminal (Output), a source connected to a drain of a succeeding N-type transistor D, and a gate connected to the input terminal (Input-2).

The N-type transistor K has a drain connected to the output terminal (Output), a source connected to the drain of the succeeding N-type transistor D, and a gate connected to the input terminal (Input-1).

The N-type transistor D is formed such that channel length of the N-type transistor D is sufficiently longer than that of each of the P-type transistors H and I and the N-type transistors J and K.

It is to be noted that while the transistor circuits according to the above embodiments have been described by using an inverter circuit, a NAND circuit, and a NOR circuit as an example of a cell-forming circuit, the present invention can be similarly applied to circuits formed by using AND, OR, EXCLUSIVE-OR, FLIP-FLOP and other circuit components and ROM, RAM, PLAT and other circuit components.

As described above, according to the present invention, in a transistor circuit including a cell using a type of MOS transistor that stands by in a state of being supplied with supply voltage, a MOS transistor for interrupting leakage current that has a channel length longer than that of the MOS transistor used in the cell is additionally placed so as to be connected in series with the cell (between the supply voltage and a ground). The MOS transistor for interrupting leakage current is configured to conduct only while the transistor circuit operates and not to conduct while the transistor circuit is in a standby state. Therefore, it is possible to reduce unnecessary power consumption by the leakage current of the cell (between the supply voltage and the ground).

In addition, the transistor circuit includes a MOS transistor that does not produce such effect while the transistor circuit is operated and makes the potential of an output terminal a high potential or a low potential (not intermediate potential) only while the transistor circuit is in a standby state. Therefore, it is also possible to reduce unnecessary power consumption by through-transistor current of a standby type circuit in a succeeding stage.

What is claimed is:

1. A transistor circuit which uses a MOS transistor and stands by in a state of being supplied with a supply voltage, said transistor circuit comprising:

a main circuit including one or more input terminals, one or more output terminals, one or more power supply-side terminals, and one or more MOS transistors;

a P-type transistor; and an N-type transistor;

wherein a supply voltage identical with the supply voltage supplied to said main circuit is applied to a source of said P-type transistor;

a gate of said P-type transistor and a gate of said N-type transistor are connected to an enable terminal for on-off control of operation of said main circuit;

a drain of said P-type transistor is connected to at least one said output terminal of said main circuit;

a drain of said N-type transistor is connected to at least one ground-side terminal of said main circuit;

a source of said N-type transistor is grounded; and a channel length of said N-type transistor is formed so as to be longer than a channel of said MOS transistor included in said main circuit.

2. A transistor circuit which uses a MOS transistor and stands by in a state of being supplied with a supply voltage, said transistor circuit comprising:

a main circuit including one or more input terminals, one or more output terminals, one or more power supply-side terminals, and one or more MOS transistors;

a P-type transistor; and an N-type transistor;

wherein the supply voltage to be supplied to said main circuit is applied to a source of said P-type transistor;

a drain of said P-type transistor is connected to at least one said power supply-side terminal of said main circuit;

a gate of said P-type transistor and a gate of said N-type transistor are connected to an enable terminal for on-off control of operation of said main circuit;

a drain of said N-type transistor is connected to at least one said output terminal of said main circuit;

at least one ground-side terminal of said main circuit and a source of said N-type transistor are grounded; and a channel length of said P-type transistor is formed so as to be longer than a channel length of said MOS transistor included in said main circuit.

3. A transistor circuit which uses a MOS transistor and stands by in a state of being supplied with a supply voltage, said transistor circuit comprising:

one or more logical circuits having a portion where a gate of a P-type transistor and a gate of a first N-type transistor are connected to each other as an input terminal, and having a portion where a drain of said P-type transistor and a drain of said first N-type transistor are connected to each other as an output terminal, the supply voltage being applied to a source of said P-type transistor; and a second N-type transistor having a drain connected to a source of said first N-type transistor of one arbitrary said logical circuit, a source connected to a ground, a gate as an enable terminal for on-off control of operation of said logical circuit, and a channel length formed so as to be longer than a channel length of said first N-type transistor.

4. A transistor circuit which uses a MOS transistor and stands by in a state of being supplied with a supply voltage, said transistor circuit comprising:

one or more logical circuits having a portion where a gate of a first P-type transistor and a gate of a first N-type transistor are connected to each other as an input terminal, and having a portion where a drain of said first P-type transistor and a drain of said first N-type transistor are connected to each other as an output terminal, said supply voltage being applied to a source of said first P-type transistor;

a second N-type transistor having a drain connected to a source of said first N-type transistor of one arbitrary said logical circuit, a source connected to a ground, a gate as an enable terminal for on-off control of operation of said logical circuit, and a channel length formed so as to be longer than a channel length of said first N-type transistor; and a second P-type transistor having a source supplied with said supply voltage, a drain connected to said output terminal, and a gate connected to said enable terminal.

5. A transistor circuit which uses a MOS transistor and stands by in a state of being supplied with a supply voltage, said transistor circuit comprising:

one or more logical circuits having a portion where a gate of a first P-type transistor and a gate of an N-type transistor are connected to each other as an input terminal, and having a portion where a drain of said first P-type transistor and a drain of said N-type transistor are connected to each other as an output terminal, a source of said N-type transistor being grounded; and a second P-type transistor having a drain connected to a source of said first P-type transistor of one arbitrary said logical circuit, a source supplied with the supply voltage, a gate as an enable terminal for on-off control of operation of said logical circuit, and a channel length formed so as to be longer than a channel length of said first P-type transistor.

6. A transistor circuit which uses a MOS transistor and stands by in a state of being supplied with a supply voltage, said transistor circuit comprising:

one or more logical circuits having a portion where a gate of a first P-type transistor and a gate of a first N-type transistor are connected to each other as an input terminal, and having a portion where a drain of said first P-type transistor and a drain of said first N-type transistor are connected to each other as an output terminal, a source of said first N-type transistor being grounded;

a second P-type transistor having a drain connected to a source of said first P-type transistor of one arbitrary said logical circuit, a source supplied with the supply voltage, a gate as an enable terminal for on-off control of operation of said logical circuit, and a channel length formed so as to be longer than a channel length of said first P-type transistor; and a second N-type transistor having a source connected to a ground, a drain connected to said output terminal, and a gate connected to said enable terminal.

7. A transistor circuit which uses a MOS transistor and stands by in a state of being supplied with a supply voltage, said transistor circuit comprising:

one or more logical circuits having a portion where a gate of a first P-type transistor and a gate of a first N-type transistor are connected to each other as a first input terminal, having a portion where a gate of a second P-type transistor and a gate of a second N-type transistor are connected to each other as a second input terminal, and having a portion where a drain of said first P-type transistor, a drain of said second P-type transistor, and a drain of said first N-type transistor are connected to each other as an output terminal, said supply voltage being applied to a source of said first P-type transistor and a source of said second P-type transistor, and a source of said first N-type transistor being connected to a drain of said second N-type transistor;

a third N-type transistor having a drain connected to a source of said second N-type transistor of one arbitrary said logical circuit, a source connected to a ground, a gate as an enable terminal for on-off control of operation of said logical circuit, and a channel length formed so as to be longer than a channel length of said first N-type transistor and a channel of said second N-type transistor; and a third P-type transistor having a source supplied with said supply voltage, a drain connected to said output terminal, and a gate connected to said enable terminal.

8. A transistor circuit which uses a MOS transistor and stands by in a state of being supplied with a supply voltage, said transistor circuit comprising:

one or more logical circuits having a portion where a gate of a first P-type transistor and a gate of a first N-type transistor are connected to each other as a second input terminal, having a portion where a gate of a second P-type transistor and a gate of a second N-type transistor are connected to each other as a first input terminal, and having a portion where a drain of said first N-type transistor, a drain of said second N-type transistor, and a drain of said second P-type transistor are connected to each other as an output terminal, said supply voltage being applied to a source of said first P-type transistor, a drain of said first P-type transistor being connected to a source of said second P-type transistor, and a source of said first N-type transistor being connected to a source of said second N-type transistor;

a third N-type transistor having a drain connected to the source of said first N-type transistor and the source of said second N-type transistor of one arbitrary said logical circuit, a source connected to a ground, a gate as an enable terminal for on-off control of operation of said logical circuit, and a channel length formed so as to be longer than a channel length of said first N-type transistor and a channel length of said second N-type transistor; and a third P-type transistor having a source supplied with said supply voltage, a drain connected to said output terminal, and a gate connected to said enable terminal.

9. A transistor circuit as claimed in any one of claims 1 to 8, wherein the transistor recited as having a channel length greater than the channel length of at least another transistor in the circuit is connected to interrupt source to drain leakage current between a supply voltage and ground.

10. A transistor circuit as claimed in any one of claims 1 to 8, where said transistor recited as having a channel length longer than the channel length of at least another transistor is an MOS transistor for interrupting leakage current.

11. A transistor circuit as claimed in claim 10 further including means for causing said MOS transistor to conduct only while the transistor circuit operates and not to conduct while the transistor circuit is in a standby state, whereby power consumption by the leakage current is reduced.

* * * * *